US009233835B2

(12) United States Patent
Aleksov et al.

(10) Patent No.: US 9,233,835 B2
(45) Date of Patent: Jan. 12, 2016

(54) SHAPED AND ORIENTED SOLDER JOINTS

(75) Inventors: Aleksandar Aleksov, Chandler, AZ (US); Sanka Ganesan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 13/992,791

(22) PCT Filed: Dec. 6, 2011

(86) PCT No.: PCT/US2011/063435
§ 371 (c)(1),
(2), (4) Date: Jun. 10, 2013

(87) PCT Pub. No.: WO2013/085492
PCT Pub. Date: Jun. 13, 2013

(65) Prior Publication Data
US 2013/0335939 A1     Dec. 19, 2013

(51) Int. Cl.
*H05K 7/10*     (2006.01)
*B81B 7/00*     (2006.01)
(Continued)

(52) U.S. Cl.
CPC ........... *B81B 7/0006* (2013.01); *B23K 35/0288* (2013.01); *H01L 23/49816* (2013.01); *H01L 24/14* (2013.01); *H01L 24/13* (2013.01); *H01L 24/16* (2013.01); *H01L 2224/1132* (2013.01); *H01L 2224/11474* (2013.01); *H01L 2224/11849* (2013.01); *H01L 2224/11903* (2013.01); *H01L 2224/13012* (2013.01); *H01L 2224/13014* (2013.01); *H01L 2224/13082* (2013.01); *H01L 2224/13111* (2013.01);

(Continued)

(58) Field of Classification Search
CPC ........... H05K 2201/10734; H05K 2201/10719
USPC .......... 361/760, 767, 768, 777, 779, 783, 808
See application file for complete search history.

(56) References Cited

U.S. PATENT DOCUMENTS 5,484,963 A * 1/1996 Washino ....................... 174/261
6,268,568 B1    7/2001 Kim
(Continued)

FOREIGN PATENT DOCUMENTS

JP          10-284500 A    10/1998
WO      2013/085492 A1    6/2013

OTHER PUBLICATIONS

International Search Report and Written Opinion Received for PCT Patent Application No. PCT/US2011/063435, Mailed on Aug. 24, 2012, 8 pages.

(Continued)

*Primary Examiner* — Hoa C Nguyen
(74) *Attorney, Agent, or Firm* — Winkle, PLLC

(57) ABSTRACT

The present description relates to the field of fabricating microelectronic assemblies, wherein a microelectronic device may be attached to a microelectronic substrate with a plurality of shaped and oriented solder joints. The shaped and oriented solder joints may be substantially oval, wherein the major axis of the substantially oval solder joints may be substantially oriented toward a neutral point or center of the microelectronic device. Embodiments of the shaped and oriented solder joint may reduce the potential of solder joint failure due to stresses, such as from thermal expansion stresses between the microelectronic device and the microelectronic substrate.

13 Claims, 9 Drawing Sheets

(51) Int. Cl.
*B23K 35/02* (2006.01)
*H01L 23/498* (2006.01)
*H05K 3/34* (2006.01)
*H01L 23/00* (2006.01)

(52) U.S. Cl.
CPC .. *H01L 2224/141* (2013.01); *H01L 2224/1403* (2013.01); *H01L 2224/14135* (2013.01); *H01L 2224/14136* (2013.01); *H01L 2224/14177* (2013.01); *H01L 2224/14179* (2013.01); *H01L 2224/16225* (2013.01); *H01L 2224/16227* (2013.01); *H01L 2224/81815* (2013.01); *H01L 2924/01322* (2013.01); *H01L 2924/3511* (2013.01); *H05K 3/3436* (2013.01); *H05K 2201/09418* (2013.01); *H05K 2201/10734* (2013.01)

(56) References Cited

U.S. PATENT DOCUMENTS

| | | | |
|---|---|---|---|
| 6,774,474 B1 * | 8/2004 | Caletka et al. | 257/686 |
| 6,793,500 B1 | 9/2004 | Budell et al. | |
| 6,836,018 B2 | 12/2004 | Kim et al. | |
| 7,433,201 B2 * | 10/2008 | Cherian | 361/767 |
| 2008/0185735 A1 * | 8/2008 | Pham et al. | 257/778 |
| 2013/0062755 A1 * | 3/2013 | Kuo et al. | 257/737 |
| 2013/0093079 A1 * | 4/2013 | Tu et al. | 257/737 |

OTHER PUBLICATIONS

International Preliminary Report on Patentability and Written Opinion received for PCT Patent Application No. PCT/US2011/063435, mailed on Jun. 19, 2014, 5 pages.

* cited by examiner

SHAPED AND ORIENTED SOLDER JOINTS

BACKGROUND

Embodiments of the present description generally relate to the field of microelectronic assemblies and, more particularly, to the attachment of microelectronic devices to microelectronic substrates using shaped and oriented solder joints.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
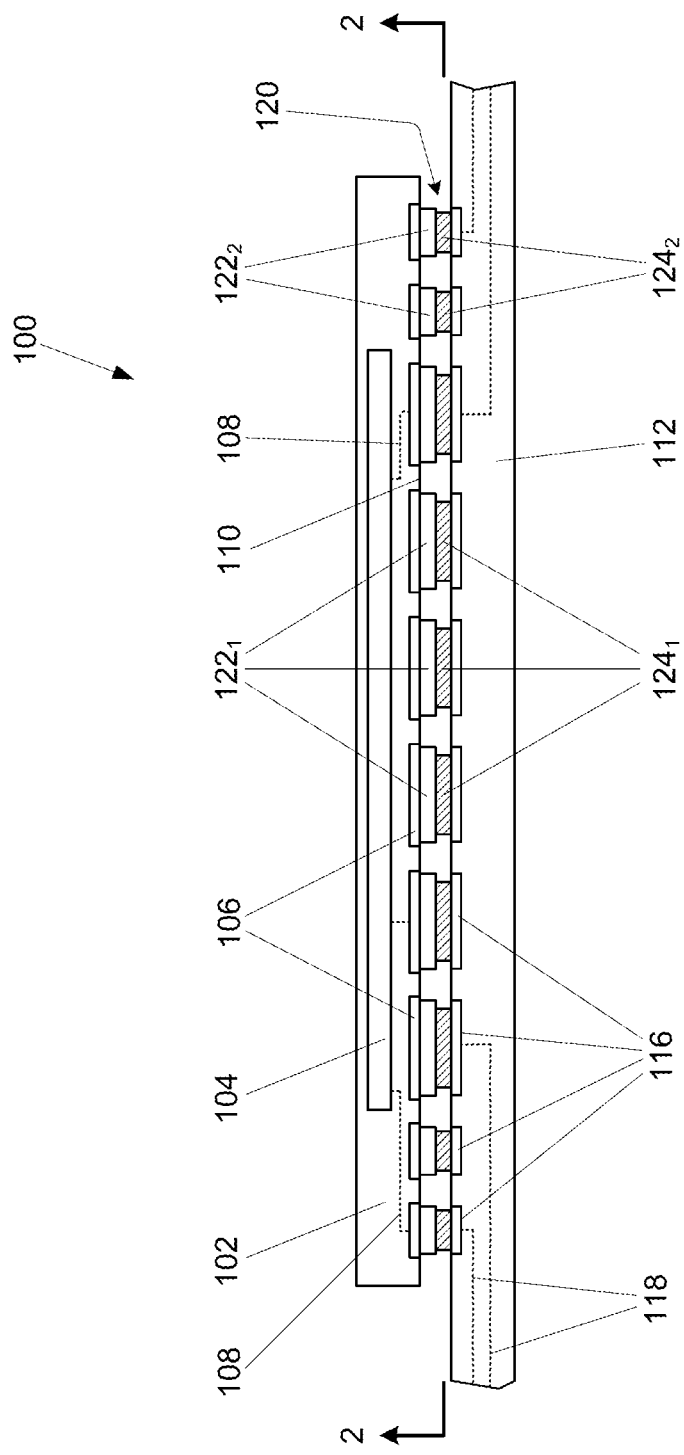
FIG. 1 is a side cross-sectional view of a microelectronic device mounted on a microelectronic substrate, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic assemblies, wherein a microelectronic device may be attached to a microelectronic substrate with a plurality of shaped and oriented solder joints. The shaped and oriented solder joints may be substantially oval, wherein the major axis of the oval solder joints may be substantially oriented toward a neutral point or center of the microelectronic device. Embodiments of the shaped and oriented solder joint may reduce the potential of solder joint failure due to stresses, such as from thermal expansion stress between the microelectronic device and the microelectronic substrate. In the production of microelectronic assemblies, microelectronic devices are generally mounted on microelectronic substrates, which provide electrical communication routes between the microelectronic devices and external components. As shown in FIG. 1, a microelectronic assembly 100 may comprise a microelectronic device 102 attached to a microelectronic substrate 112. The microelectronic device 102 may be any appropriate device, such as a packaged microelectronic die 104 (e.g. a microprocessor, a chipset, a graphics device, a wireless device, a memory device, an application specific integrated circuit, or the like), or may be a bare microelectronic die. The microelectronic die 104 may be packaged in any manner known in the art. The microelectronic substrate 112 may be any appropriate substrate, such as an interposer, a motherboard, and the like, and may be primarily composed of any appropriate material, including, but not limited to, bismaleimine triazine resin, fire retardant grade 4 material, polyimide materials, glass reinforced epoxy matrix material, and the like, as well as laminates or multiple layers thereof.

A plurality of interconnects 120 may extend between bond pads 106 on a land side 110 of the microelectronic device 102 and mirror-image bond pads 116 on the microelectronic substrate 112. The microelectronic device bond pads 106 may be in electrical communication with the microelectronic die 104 through conductive routes (shown as dashed lines 108). The microelectronic substrate bond pads 116 may be in electrical communication with external components (not shown) through conductive routes (shown as dashed lines 118) on or within the microelectronic substrate 112. The microelectronic device conductive routes 108 and the microelectronic substrate conductive routes 118 may be composed of any conductive material, including but not limited to metals, such as copper and aluminum, and alloys thereof As will be understood to those skilled in the art, the microelectronic device conductive routes 108 and the microelectronic substrate conductive routes 118 may be formed as a plurality of conductive traces (not shown) formed on layers of dielectric material (constituting the layers of the microelectronic substrate material), which are connected by conductive vias (not shown)

The interconnects 120 may comprise conductive bumps/pillars, illustrated as first conductive pillars $122_1$ and second conductive pillars $122_2$, extending from microelectronic device bond pads 106, and solder bumps, illustrated as first solder bumps $124_1$ and second solder bumps $124_2$, extending respectively between the first conductive pillars $122_1$ and second conductive pillars $122_2$, and the microelectronic substrate bond pads 116. The first conductive pillars $122_1$ and second conductive pillars $122_2$ may be made from any appropriate conductive material, including but not limited to copper and copper-containing alloys The first solder bumps $124_1$ and the second solder bumps $124_2$ can be made any appropriate material, including but not limited to lead/tin alloys, such as tin/lead solder, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic device 102 is attached to the microelectronic substrate 112, the first solder bumps $124_1$ and the second solder bumps $124_2$ may be reflowed, either by heat, pressure, and/or sonic energy to secure the first solder bumps $124_1$ and the second solder bumps $124_2$ between their respective first conductive pillars $122_1$ and second conductive pillars $122_2$, and the microelectronic substrate bond pads 116.

In such microelectronic assemblies 100, a mismatch of the coefficient of thermal expansion may exist between the microelectronic device 102 and the microelectronic substrate 112. Such a mismatch may cause the microelectronic assembly 100 to warp at room temperature (about 25 degrees Celsius) and/or at reflow temperature (for example, about 260 degrees Celsius). Reflow temperature is temperature to which first solder bumps $124_1$ and second solder bumps $124_2$ are heated to attach to the respective first conductive pillars $122_1$ and second conductive pillars $122_2$, and the microelectronic substrate bond pads 116. Such warpage may result in interconnect (e.g. solder) joint opens and/or interconnect (e.g. solder) bridging during the reflow and cooling process. As will be understood to those skilled in the art, the risk of interconnect joint opens/bridging may be greater in large form-factor microelectronic assemblies, in microelectronic devices having relatively large microelectronic dice therein, in microelectronic assemblies having relatively thin microelectronic devices (for example, microelectronic device thicknesses less than about 125 µm), in microelectronic devices having thin-core or coreless substrates incorporated therein, and in solder grid array (SGA) microelectronic packages.

Figure 2:
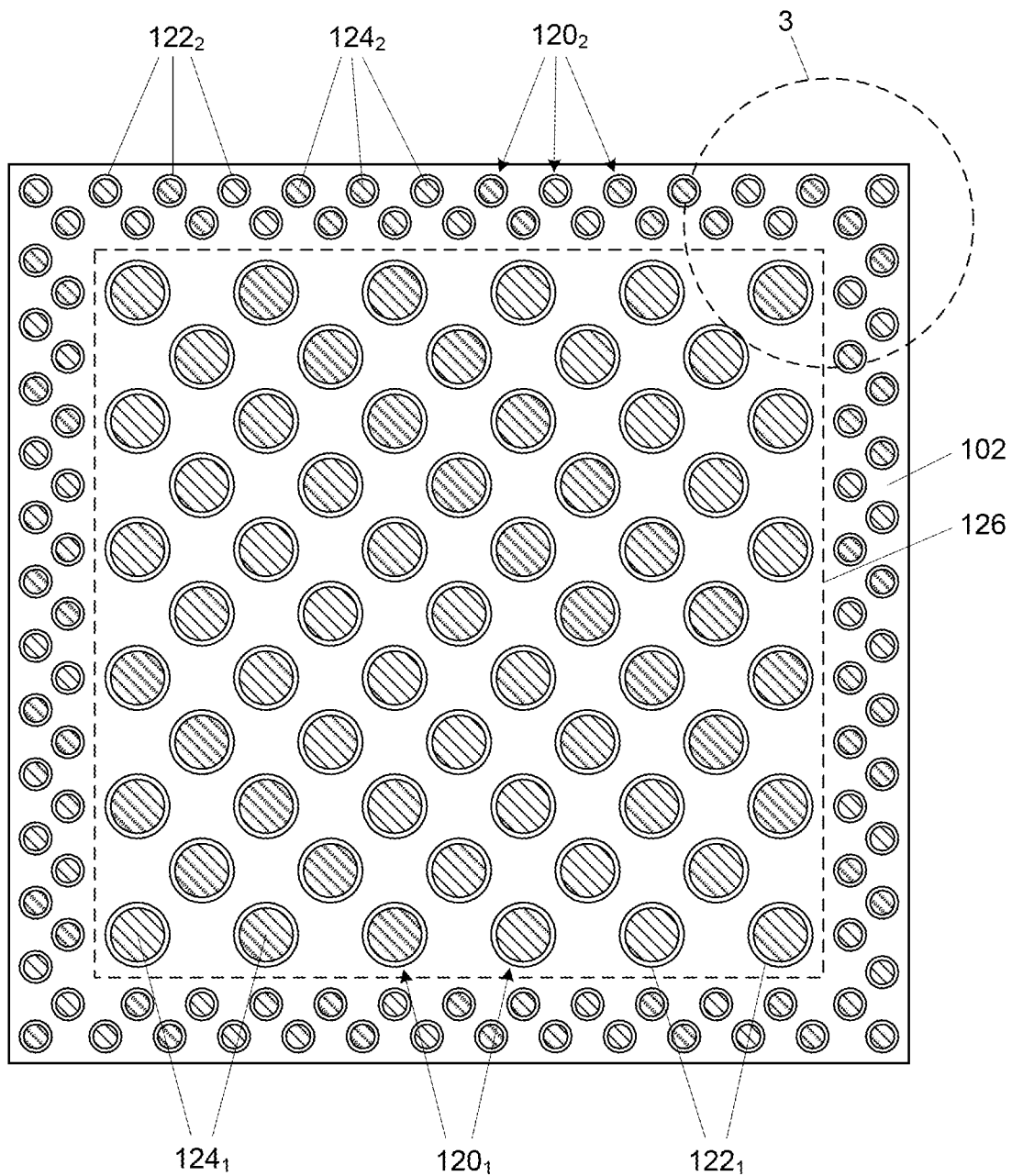
FIG. 2 is a bottom plan view of the microelectronic structure of FIG. 1 along line 2-2, as known in the art.
Figure 3:
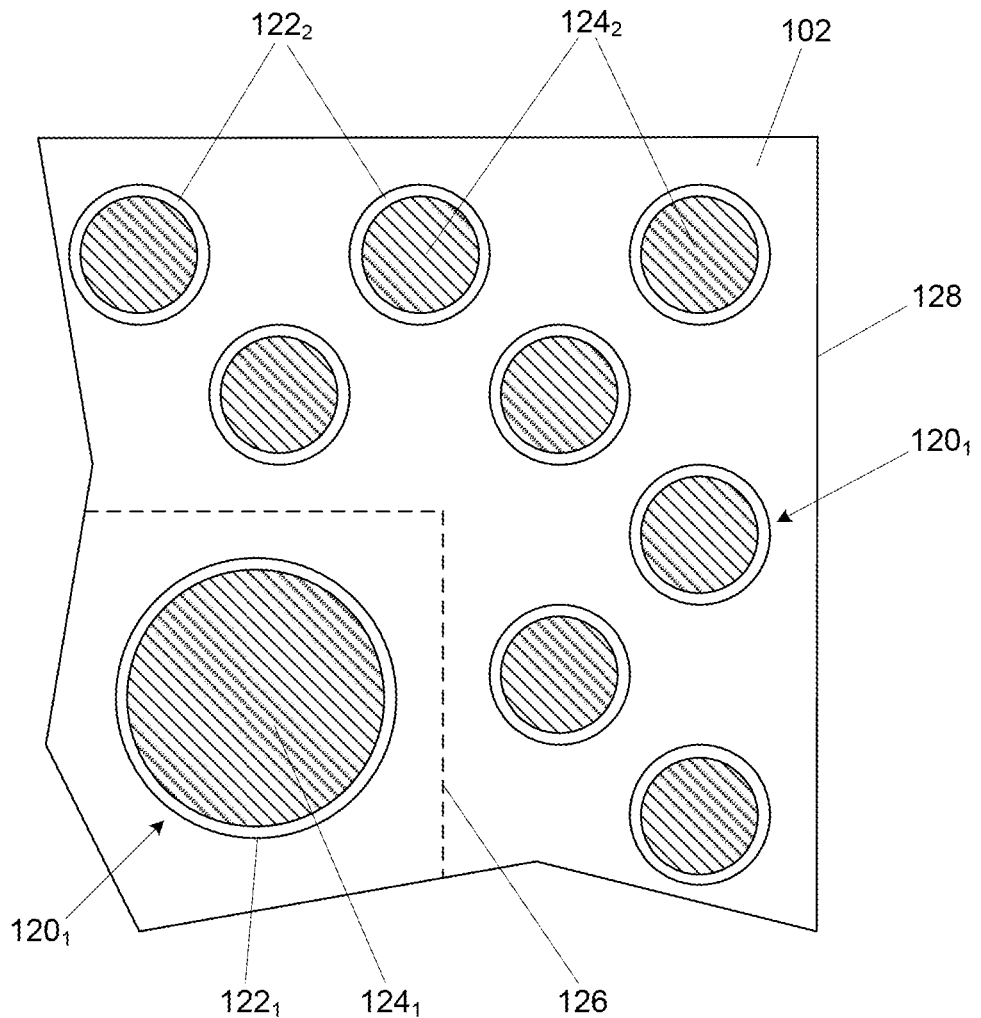
FIG. 3 is view of inset 3 of FIG. 2, as known in the art.

As shown in FIGS. 2 and 3, the interconnects 120 and may be grouped as first interconnects $120_1$ and second interconnects $120_2$. The first interconnects $120_1$ may comprise the first conductive pillars $122_1$ and respective first solder bumps $124_1$, and may be positioned within a periphery 126 of the microelectronic die 104 (see FIG. 1). The second interconnects $120_2$ may comprise the second conductive pillars $122_2$ and respective second solder bumps $124_2$, may be positioned outside the microelectronic device periphery 126, and may be proximate a periphery 128 of the microelectronic device 102. Although the second interconnects $120_2$ are illustrated in two peripheral rows, it is understood that there may be any appropriate number of peripheral rows.

The first interconnects $120_1$ may be used for core electrical signals, such as power and ground, and may be large relative to the second interconnects $120_2$. The second interconnect $120_2$ may be used for input/output electrical signals, as will be understood to those skilled in the art. As will be understood to those skilled in the art, the relatively larger first interconnect $120_1$ are less susceptible to solder joint failure due to their location and size. However, as the second interconnects $120_2$ are relatively small (e.g. smaller solder volume) and close to a periphery 126 of the microelectronic device 102, they are susceptible of solder joint failure due to stresses, such as from thermal expansion stress between the microelectronic device 102 and the microelectronic substrate 112.

Figure 4:
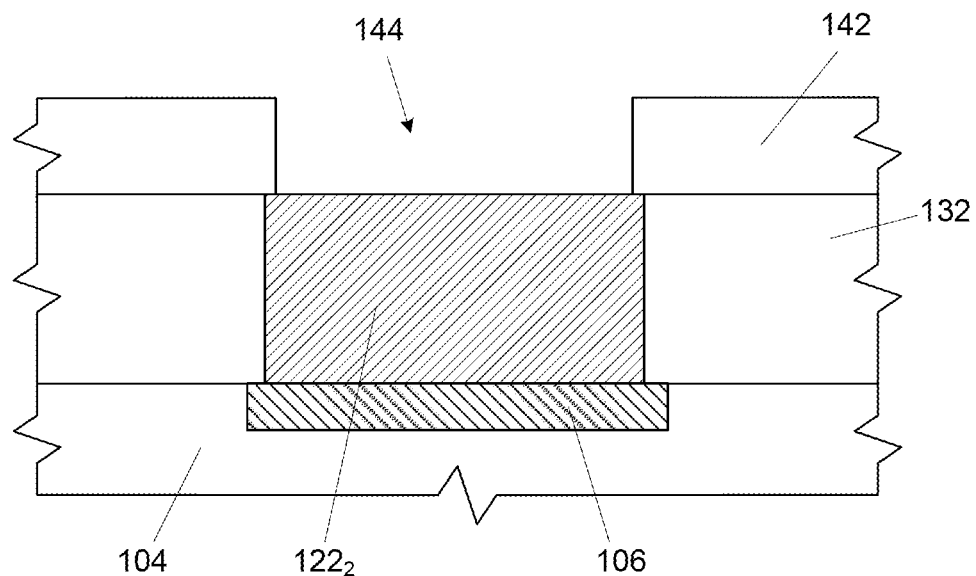
FIGS. 4-6 illustrate side cross-sectional views of the process of forming an interconnect.
Figure 5:
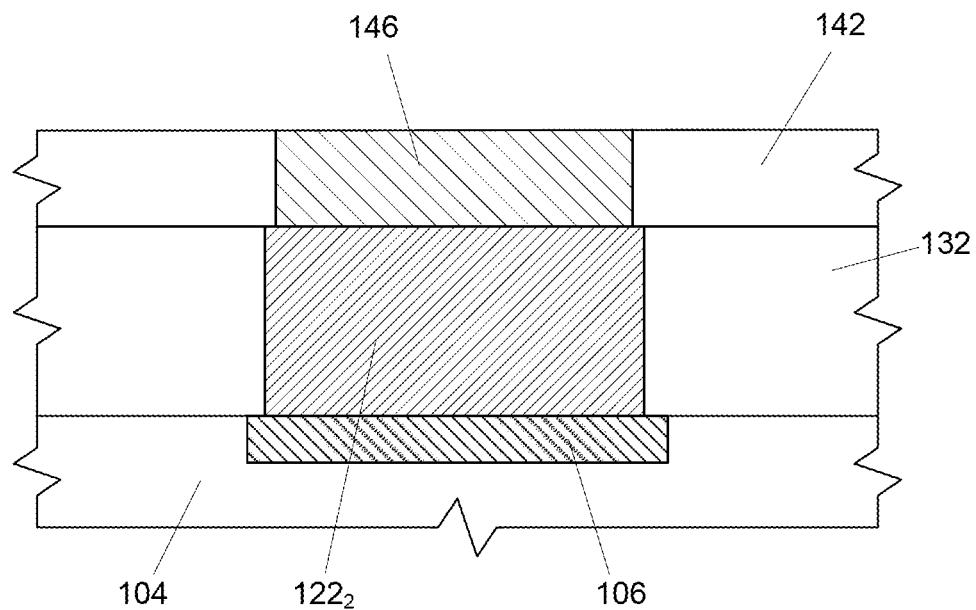
Figure 6:
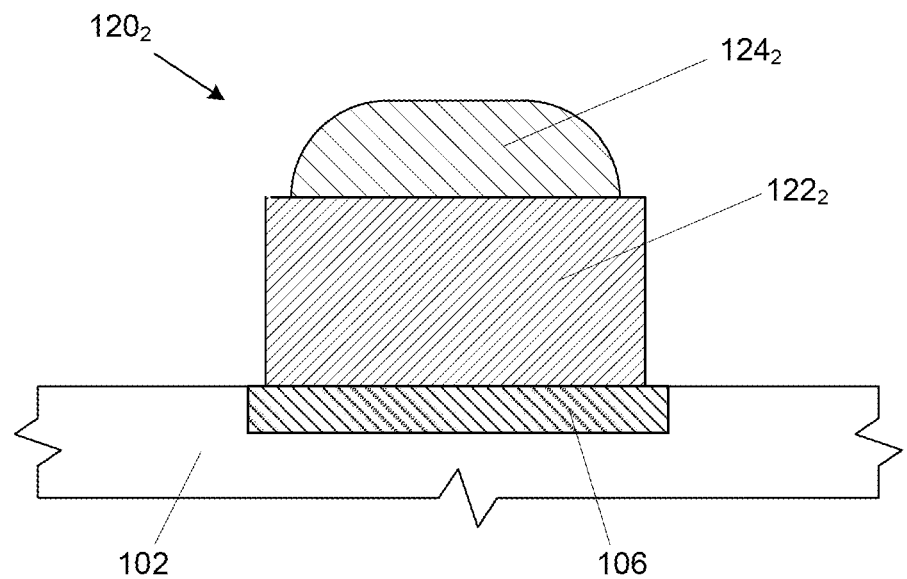

FIGS. 4-8 illustrate one embodiment of the fabrication of a second interconnect $120_2$. As shown in FIG. 4, a first sacrificial material 132, such as a photoresist, may be deposited over the microelectronic device 102 and the second conductive pillar $122_2$ formed therethrough to contact the microelectronic device bond pad 106. A second sacrificial material 142, such as a photoresist, may be deposited over the first sacrificial material 132 and the second conductive pillar $122_2$, and openings 144 may be formed therein to expose at least a portion of each second conductive pillar $122_2$. The first sacrificial material 132 and the second sacrificial material 142 may be deposited by any known technique, such as spin-on coating, lamination, chemical vapor deposition, physical vapor deposition, and the like. The openings 144 may be formed by any known techniques, such as by known photolithographic techniques. A solder material 146, such a solder paste, may be disposed in the second sacrificial material opening 144 (see FIG. 4), as shown in FIG. 5. The solder material 146 may be dispose by any known technique, such as deposition, printing, and the like. As shown in FIG. 6, the first sacrificial material 132 and the second sacrificial material 142 may be removed and the solder material 146 (see FIG. 5) may be reflowed to form the second solder bump $124_2$. It is understood that the same techniques may be used to form the first interconnects $120_1$.

Figure 7:
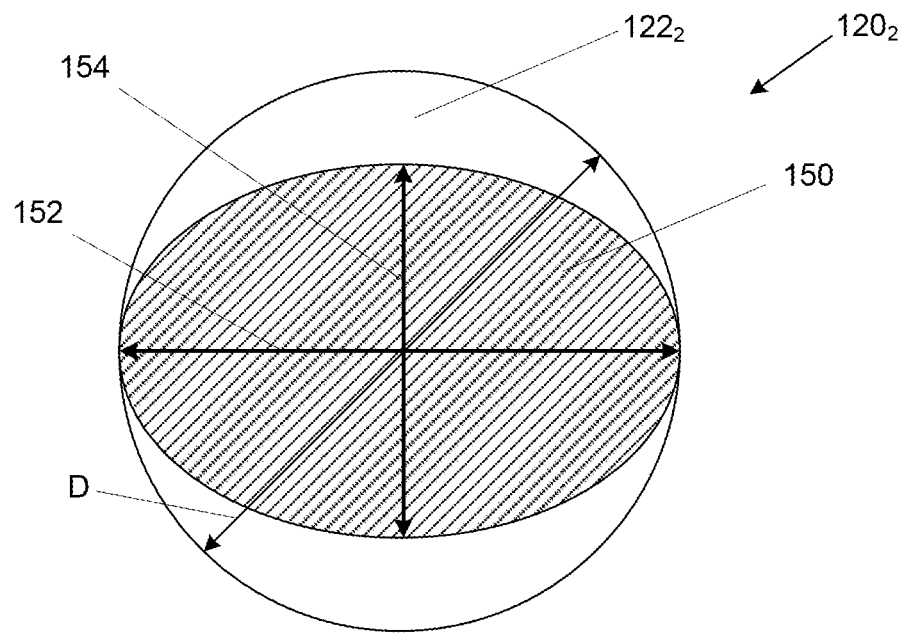
FIG. 7 illustrates a substantially oval solder bump formed on a conductive pillar, according to an embodiment of the present description.

As shown in FIGS. 1-6, the solder bumps (e.g. first solder bumps $124_1$ and second solder bumps $124_2$) may be substantially circular. However, in one embodiment of the present description, a substantially oval solder bump 150 may be formed, as shown in FIG. 7, by appropriately patterning the opening 144 in the second sacrificial material 142. The substantially oval solder bump 150 may be have a major axis 152 that is substantially perpendicular to a minor axis 154, wherein major axis 152 may be longer than the minor axis 154. In one embodiment, the substantially oval solder bump major axis 152 may extend the diameter D of the second conductive pillar $122_2$.

Figure 8:
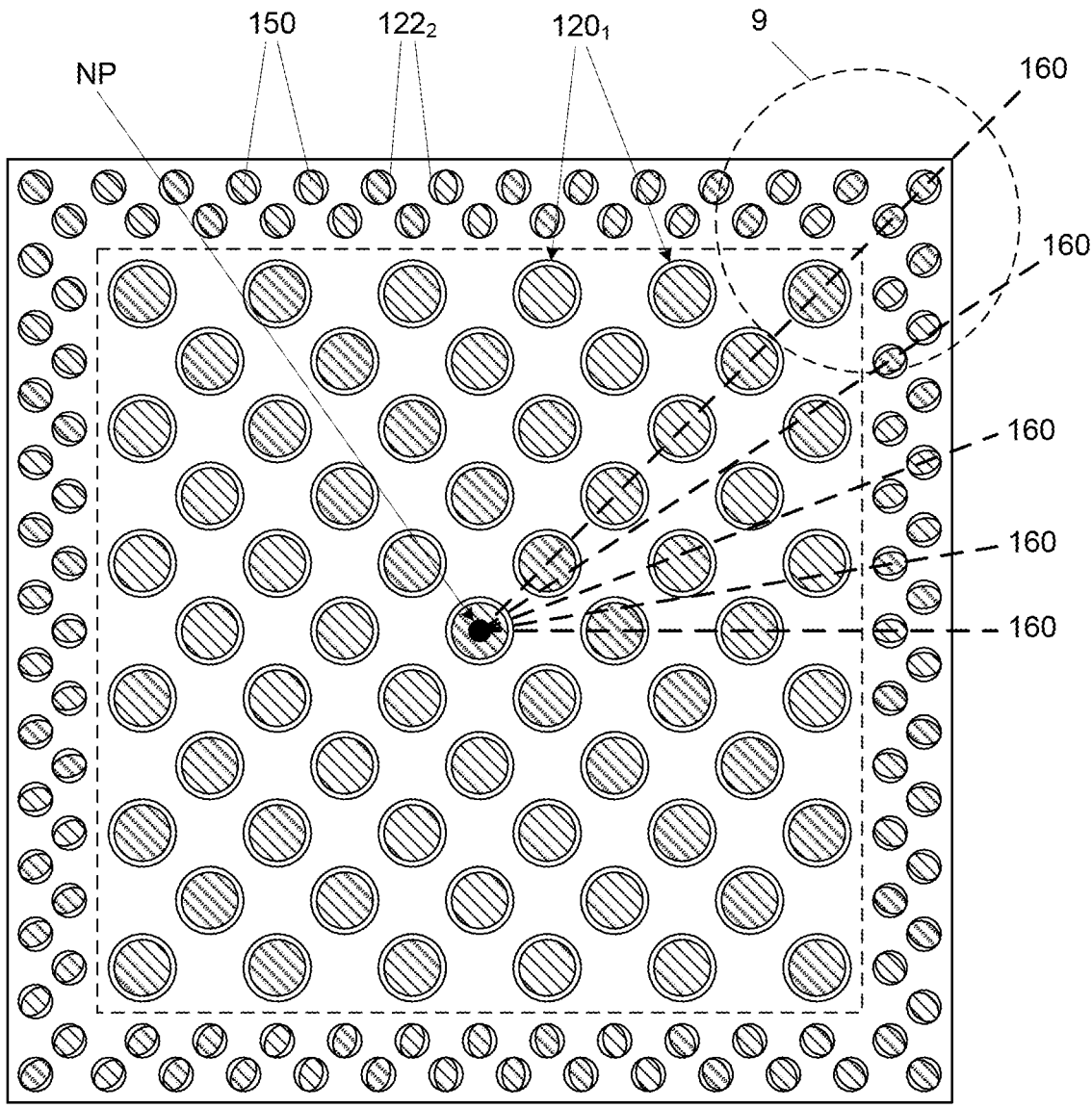
FIG. 8 is a bottom plan view of the microelectronic structure, according to an embodiment of the present description.
Figure 9:
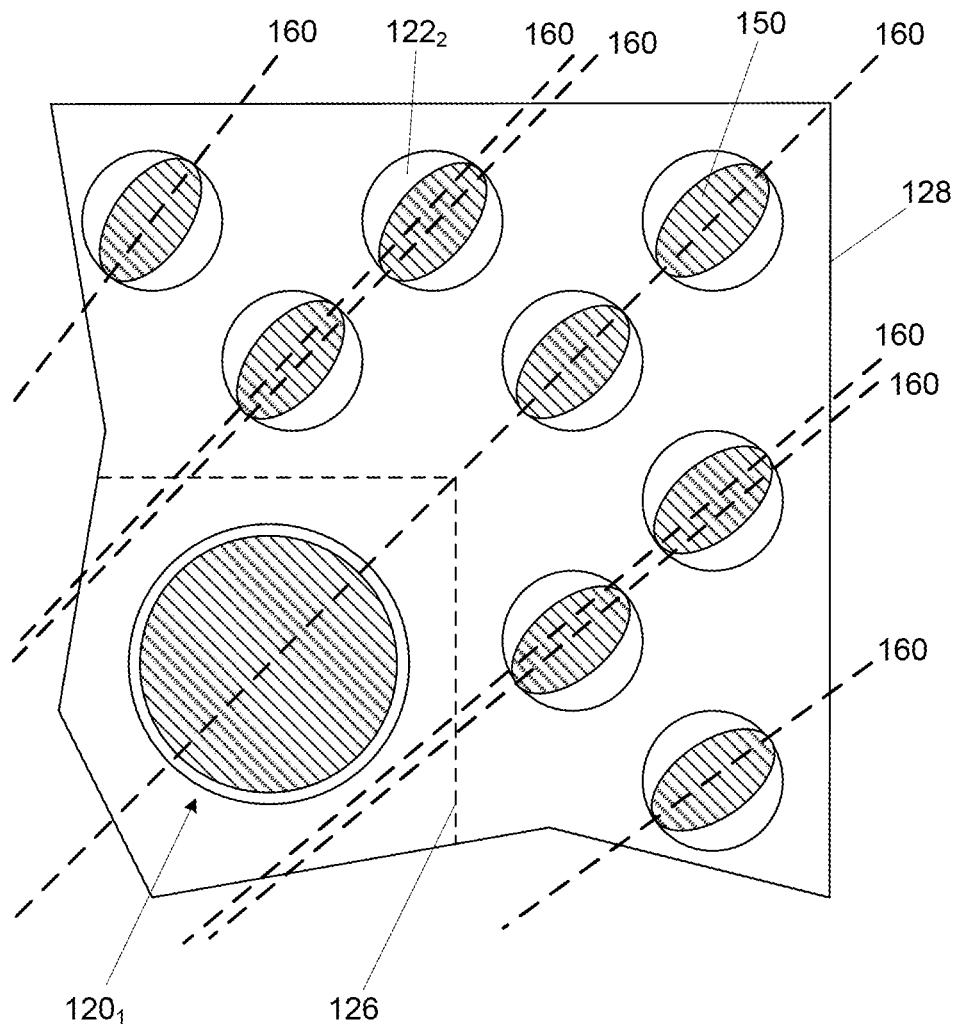
FIG. 9 is view of inset 9 of FIG. 8, according to an embodiment of the present description.

In one embodiment of the present description, as shown in FIGS. 8 and 9, the major axes 152 (see FIG. 7) of each of the substantially oval solder bumps 150 may be substantially oriented toward a neutral point NP, or center of the microelectronic device 102. In an embodiment of the present description, the major axes 152 of each substantially oval solder bumps 150 may be aligned with radial vectors 160 extending for the neutral point NP of the microelectronic device 102. Thus, the substantially oval solder bumps 150 may have a radial pattern relative to neutral point NP.

The substantially oval solder bumps 150 which are oriented radially toward the neutral point NP of the microelectronic device 102 may reduce the risk of solder joint failure, as the solder volume in the substantially oval solder bumps 150 is greater along the radial vectors 160 which is also the primary direction of stress due to differences in coefficients of thermal expansion between the microelectronic device 102 and the microelectronic substrate 112, as previously discussed.

Figure 10:
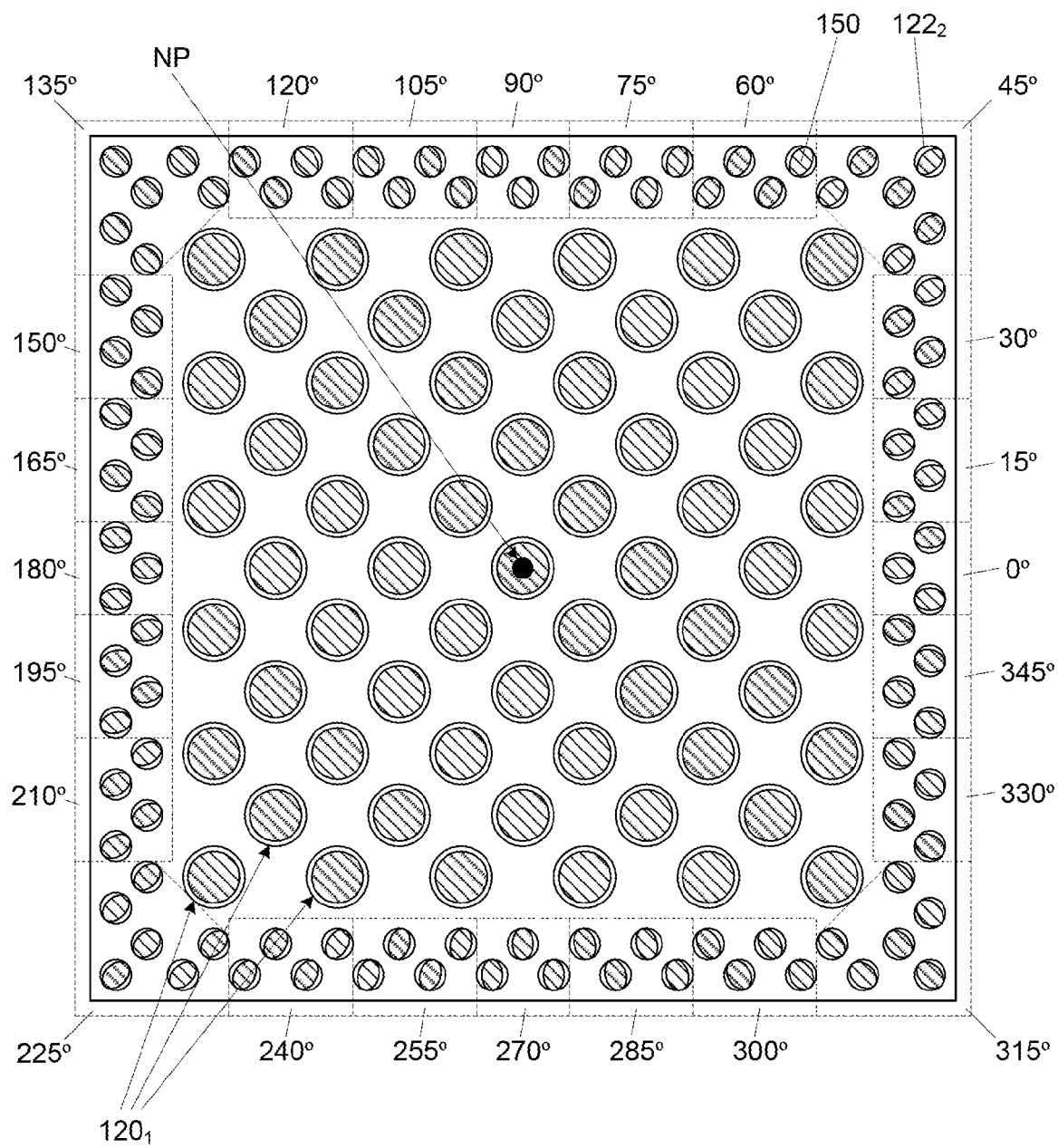
FIG. 10 is a bottom plan view of the microelectronic structure, according to another embodiment of the present description.

As will be understood to those skilled in the art, for design simplicity and/or due to limitations in design tools, it may not be possible to orient each substantially oval solder bump 150 along their respective radial vectors 160. Therefore, in one embodiment of the present application, the substantially oval solder bumps 150 may be grouped into zones, wherein in each zone the grouped substantially oval solder bumps 150 share substantially the same or common angle toward the neutral point NP of the microelectronic device 102. As shown in FIG. 10, the zones (elements 0°, 15°, 30°, 45°, ..., 330°, and 345°) may be divided into zones of 15 degrees. Thus, zone 0° would have its substantially solder bumps 150 oriented substantially horizontally, as would its complementary zone 180°. Moving counterclockwise, zone 15° would have its substantially oval solder bumps 150 oriented at 15 degrees from horizontal (i.e. zone 0°) substantially toward the neutral point NP of the microelectronic device 102, and so on through each of the zones (elements 0°, 15°, 30°, 45°, ..., 330°, and 345°). It is understood that any appropriate angle and zone segmentation may be chosen.

Figure 11:
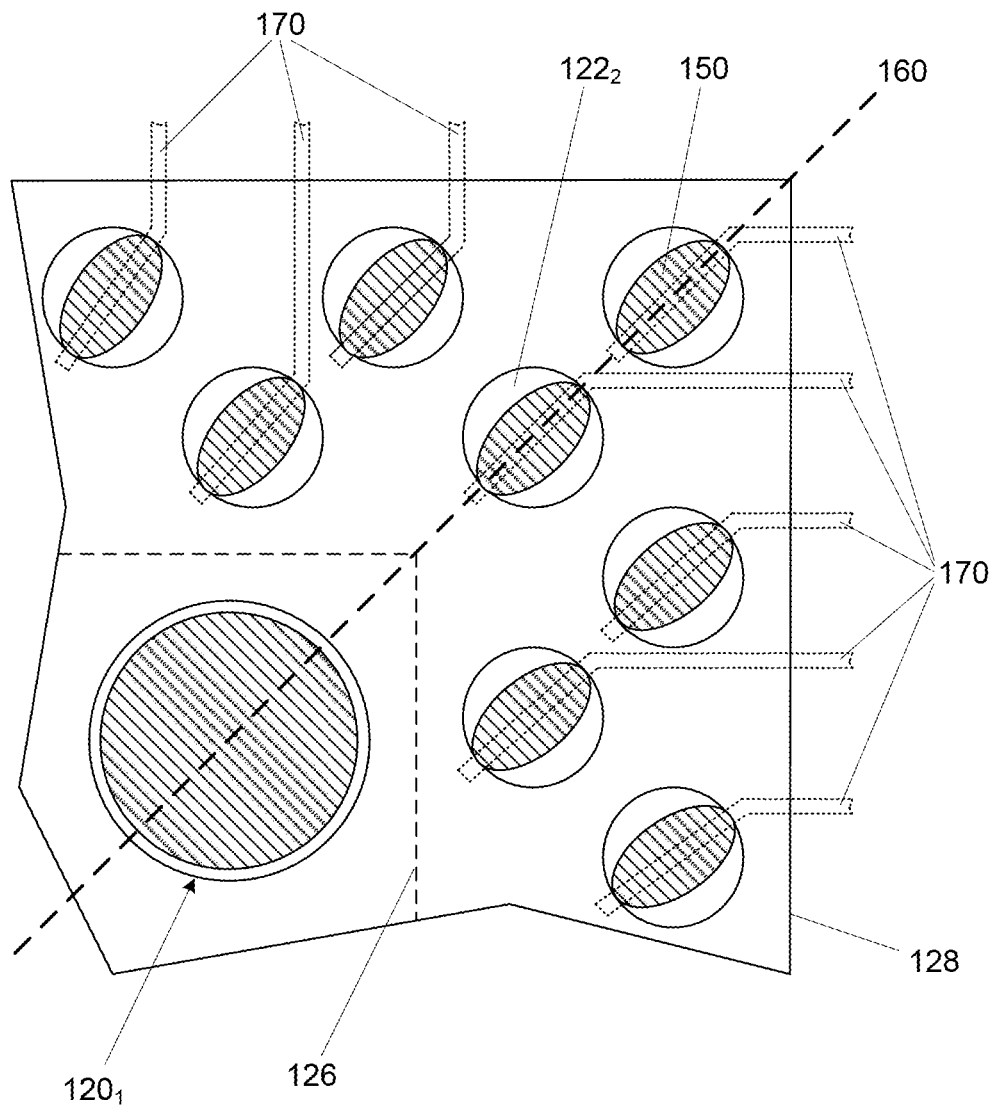
FIG. 11 is a bottom plan view of the microelectronic structure, according to another embodiment of the present description.

FIG. 11 illustrates an embodiment of the present description, wherein the substantially oval oriented solder bumps 150 may be attached to line traces 170 (shown in dashed lines) formed on the microelectronic substrate 112 (not shown—see FIG. 1). Such an arrangement is known as line-to-line (L2L) first level interconnect (FLI) architecture. With such microelectronic substrate line traces 170, there are no microelectronic substrate bond pads, such as microelectronic substrate bond pads 116 shown in FIG. 1. Thus, the attachment surface area for a substantially oval solder bumps 150 will be small. Therefore, at least a portion of the microelectronic substrate line traces 170 may also be substantially oriented with the radial vectors 160 such that the maximum volume of the substantially oval solder bumps 150 are aligned along the microelectronic substrate line traces 170 to improve the reliability of the attachment of the substantially oval solder bumps 150 to the microelectronic substrate line traces 170. It is understood that a variety of attachment and routing options are available.

It is understood that the subject matter of the present description is not necessarily limited to specific applications illustrated in FIGS. 1-11. The subject matter may be applied to other microelectronic device and assembly applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   a microelectronic device;
   a microelectronic substrate; and
   a plurality of interconnects connecting the microelectronic device and the microelectronic substrate, wherein the plurality of interconnects includes a plurality of substantially oval solder bumps which are substantially radially oriented by a major axis thereof toward a neutral point of the microelectronic device, wherein the plurality of interconnects includes a plurality substantially circular conductive pillars, and wherein the substantially oval solder bumps are disposed on the plurality of substantially circular conductive pillars, wherein the microelectronic substrate includes a plurality of line traces to which the substantially oval solder bumps are attached, and wherein at least a portion of each microelectronic substrate line trace is substantially radially oriented toward the microelectronic device neutral point and wherein the substantially oval solder bumps are attached to the microelectronic substrate line trace portions.

2. The apparatus of claim 1, wherein the plurality of substantially oval solder bumps are grouped into zones, wherein each of the substantially oval solder bumps with each of the zones are substantially radially oriented by a major axis thereof at a common angle toward a neutral point of the microelectronic device.

3. The apparatus of claim 1, wherein the plurality of conductive pillars comprises a copper-containing material.

4. The apparatus of claim 1, wherein the microelectronic device includes a microelectronic die and wherein the plurality of substantially oval solder bumps reside outside a periphery of the microelectronic die.

5. The apparatus of claim 1, wherein the substantially oval solder bumps comprises a lead/tin solder.

6. The apparatus of claim 1, wherein the substantially oval solder bumps comprise a lead-free solder.

7. An apparatus, comprising:
   a microelectronic device;
   a microelectronic substrate; and
   a plurality of interconnects connecting the microelectronic device and the microelectronic substrate, wherein the plurality of interconnects includes a plurality of substantially oval solder bumps which are substantially radially oriented by a major axis thereof toward a neutral point of the microelectronic device, wherein the microelectronic substrate includes a plurality of line traces to which the substantially oval solder bumps are attached, and wherein at least a portion of each microelectronic substrate line trace is substantially radially oriented toward the microelectronic device neutral point and wherein the substantially oval solder bumps are attached to the microelectronic substrate line trace portions.

8. The apparatus of claim 7, wherein the plurality of substantially oval solder bumps are grouped into zones, wherein each of the substantially oval solder bumps with each of the zones are substantially radially oriented by a major axis thereof at a common angle toward a neutral point of the microelectronic device.

9. The apparatus of claim 7, wherein the plurality of interconnects includes a plurality conductive pillars and wherein the substantially oval solder bumps are disposed on the plurality of conductive pillars.

10. The apparatus of claim 9, wherein the plurality of conductive pillars comprises a copper-containing material.

11. The apparatus of claim 7, wherein the microelectronic device includes a microelectronic die and wherein the plurality of substantially oval solder bumps reside outside a periphery of the microelectronic die.

12. The apparatus of claim 7, wherein the substantially oval solder bumps comprises a lead/tin solder.

13. The apparatus of claim 7, wherein the substantially oval solder bumps comprise a lead-free solder.

* * * * *